United States Patent [19]

Koenig

[11] 3,919,709

[45] Nov. 11, 1975

[54] METALLIC PLATE-SEMICONDUCTOR ASSEMBLY AND METHOD FOR THE MANUFACTURE THEREOF

[75] Inventor: Paul W. Koenig, Clyde, N.Y.

[73] Assignee: General Electric Company, Syracuse, N.Y.

[22] Filed: Nov. 13, 1974

[21] Appl. No.: 523,343

[52] U.S. Cl. ...................... 357/65; 29/589; 357/68; 357/71

[51] Int. Cl.² .................... H01L 23/48; H01L 29/46

[58] Field of Search .................. 357/65, 67, 68, 71; 29/574, 589, 590, 591

[56] References Cited

UNITED STATES PATENTS

| | | | |
|---|---|---|---|
| 3,292,241 | 12/1966 | Carroll | 357/65 X |
| 3,331,997 | 7/1967 | Kling et al. | 357/67 |
| 3,607,148 | 9/1971 | Foote | 29/589 X |
| 3,684,930 | 8/1972 | Collins et al. | 357/71 X |

*Primary Examiner*—Siegfried H. Grimm
*Attorney, Agent, or Firm*—R. J. Mooney; D. E. Stoner

[57] ABSTRACT

Disclosed is a semiconductor assembly and a method for the manufacture thereof. The assembly includes a wafer of semiconductive material that defines two substantially parallel major surfaces and contains a preselected distribution of conductivity altering impurities such that a plurality of semiconductor device pellets is formed. Metallic mounting plates are soldered to metallic contacts on one or both of the major surfaces. The assembly is best fabricated by utilizing solder clad metallic plates, properly positioning them adjacent the metallic contacts and then heating the assembly to form solder bonds between the plates and the wafer. An alternate method is disclosed in which solder clad plates are applied to individual semiconductor pellets. Shaker feed techniques are advantageously employed.

16 Claims, 11 Drawing Figures

METALLIC PLATE-SEMICONDUCTOR ASSEMBLY AND METHOD FOR THE MANUFACTURE THEREOF

BACKGROUND OF THE INVENTION

This invention relates to semiconductors and, more particularly, to a metal plate-semiconductor body assembly and to a method for the manufacture thereof.

In the very competitive and cost conscious electronics industry, circuit and equipment designers are constantly looking for ways to achieve cost reduction without sacrificing quality or reliability. One vehicle for providing cost improvement that is currently becoming more popular is the practice of buying semiconductor pellets or wafers rather than packaged discrete semiconductor devices. Typically, the semiconductor pellets as purchased or as formed by wafer subdivision are mounted directly on printed circuit boards or other substrates in a manner that provides electrical, thermal and mechanical coupling. Following the assembly of the desired circuit, the entire package is frequently mechanically and environmentally protected by techniques such as potting in a resin compound. Thus, the semiconductor pellet is hermetically sealed in a plastic resin along with the remainder of the circuit and individual hermetic sealing of the semiconductor pellet is unnecessary.

Problems are occasionally encountered in the use of semiconductor pellets due to improper or inadequate mechanical and atmospheric protection of the pellets prior to final encapsulation by the equipment or circuit manufacturer. Thus, the semiconductor device designer is seeking ways to provide more positive protection for semiconductor pellets during shipment to customers and thereby enable circuit designers to utilize device pellets rather than packaged devices in ever more demanding electrical and environmental conditions.

However, due to the aforementioned problems, and other problems such as the need to provide proper heat sinking for very high power semiconductor devices, it is realized that total conversion from packaged discrete semiconductor device sales to pellet sales is unlikely. Consequently, a continuing concern of the semiconductor device designer is cost reduction and quality improvement of conventionally packaged semiconductor devices. Yet this effort must be vigorously continued at a time when the device designer sees a growing trend in customer preference toward unpackaged semiconductor pellets or wafers.

It is an object of this invention, therefore, to provide a semiconductor assembly that is extremely reliable and inexpensive to manufacture and will be readily acceptable to customers desiring to purchase semiconductor device pellets or wafers and yet be easily incorporated into an improved semiconductor device package of conventional design. It is also an object of this invention to provide a method for efficiently and economically manufacturing the subject semiconductor assembly.

SUMMARY OF THE INVENTION

This invention is characterized by a semiconductor assembly and by a method for the manufacture thereof. The assembly includes a semiconductor wafer that defines two substantially parallel major surfaces and contains a preselected distribution of conductivity altering impurities such that a plurality of semiconductor device pellets is formed therein. Appropriate metallic contacts are preferably on each of the major surfaces to facilitate electrical coupling to the various conductivity regions of each pellet. A plurality of metallic plates, each plate also defining two major surfaces, is soldered or otherwise bonded to one or both sides of the wafer. Generally, the plates are soldered to the contacts. It has been found that an efficient method of attaching the plates is to utilize plates that are solder clad at least on the side that is to be adjacent the wafer and, after the plates are in position, to subject the assembly to a heating step. Preferably, each plate contacts substantially the entirety of the associated metallic contact.

The advantages of the assembly described above are several. It is inexpensive to manufacture and shipment of semiconductor devices for sale in wafer or pellet form is facilitated inasmuch as each pellet is soldered to at least one metal plate and thus is reinforced. Furthermore, regarding wafer sales, any wafer breakage that may occur during shipping is likely to be between device pellets, where sub-division will normally take place, and thus is less of a problem. Also, the number of parts required to provide the subject assembly is substantially reduced by the utilization of solder clad plates. Thus, assembly cost is lower. Assembly cost is further lowered and quality is improved inasmuch as the relatively thick solder clad plates can easily be fixtured with respect to the semiconductor wafer during manufacture of the assembly. Utilization of separate solder preforms, as is common in the prior art, both requires additional parts and leads to lower yield. Yield is lowered inasmuch as it is difficult to properly fixture the extremely thin solder preforms and an improperly positioned preform can cause device shorting as outlined below.

Another advantage obtained by the utilization of the method to be described below is that the metal plates can readily be soldered to each side of the semiconductor wafer thus providing still better mechanical protection for the semiconductor device pellets and providing a balanced symmetrical stress relief medium to protect the pellets from externally or thermally generated stresses during use.

Still another advantage flowing from the use of the subject structure is a heretofore unknown ease of wafer subdivision which flows from the pellet reinforcement provided by the metal plates. Due to the presence of the plates, fracture of individual pellets during subdivision is unlikely.

A further advantage obtained by the utilization of the subject invention is that a special separation of the pellet periphery and the underlying substrate is provided while still maintaining efficient electrical, thermal and mechanical coupling therebetween. The advantages of this special separation are several. For example, consider a pellet that is to be mounted in a conventional stud package. Separating the periphery of the pellet and the plain of the stud head is advantageous inasmuch as it can increase the creepage path and thus reduce the possibility of device failure. Further advantages of this special separation shall be outlined below.

An advantage derived from the use of solder-clad plates and the method described below is that individual semiconductor pellets can readily be handled, thus providing a structure consisting of a metal plate soldered to a semiconductor pellet or a structure including two metal plates, one soldered to each side of a semiconductor pellet. The features of such a single pellet structure include durability, so needed for sale as a nonpackaged semiconductor pellet, and a simplification of the incorporation of the pellet into a conventional semiconductor device housing.

Yet a further advantage flowing from the use of the subject invention is the ability to quickly and easily make electrical connections to the device pellets and test them prior to their incorporation into a circuit or a device housing. Inasmuch as the metal plates, when mounted on a wafer, are electrically isolated from each other and are connected only to the associated pellet, testing in wafer form, as well as in pellet form, is facilitated. In the prior art, without the metal plates, such pretesting was difficult due to the difficulty of making temporary electrical connections to the fragile metal contacts.

DESCRIPTION OF THE DRAWINGS

These and other features and objects of the present invention will become more apparent when a perusal of the following description taken in conjunction with the accompanying drawings wherein.

DESCRIPTION OF THE PREFERRED METHODS AND EMBODIMENT

Figure 1:
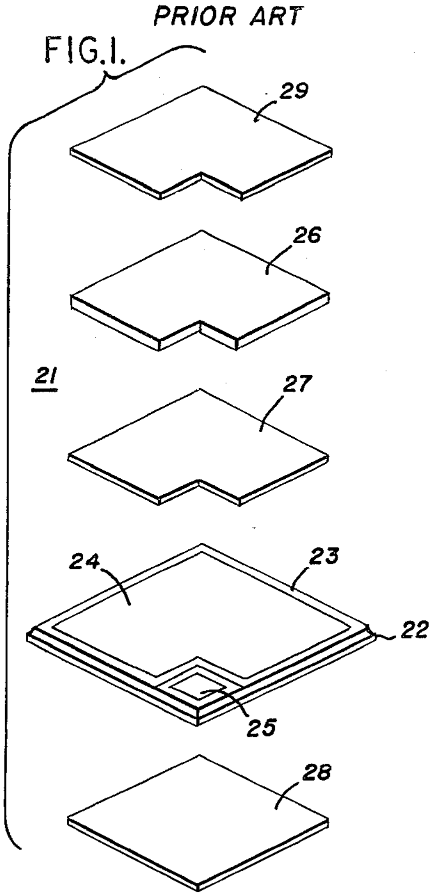
PRIOR ART FIG. 1.
FIG. 1 is an exploded view of a prior art semiconductor assembly.

Referring first to FIG. 1, there is illustrated a prior art semiconductor assembly 21 including a semiconductive body 22 that defines two generally parallel major surfaces, a first surface 23 and a second surface that is not shown in FIG. 1. The body 22 contains a preselected distribution of conductivity altering impurities. The pellet 22, per se, is conventional and may be any device such as an SCR, triac, diode, transistor, etc., or may or may not be glassivated, to mention a few of the possible variables. Assume, for example, that the body forms an SCR pellet. On the surface 23 is a metallic contact 24 and a metallic gate contact 25. A metallic contact is on the second surface also. The contacts and the impurities are put in place by conventional methods. A metal plate 26 is to be electrically, thermally, and mechanically coupled to the contact 24. Conventionally, a solder preform 27 is disposed between the contact 24 and the plate 26 to provide that coupling. In addition, preforms 28 and 29 are placed on the second major surface of the body and the upper surface of the plate 26 respectively.

Typically, the assembly illustrated in FIG. 1 is assembled and placed on a header for mounting. A heating step follows, and, upon heating, the preform 28 melts so as to form a bond that thermally, electrically, and mechanically couples the second major surface to the surface of the header. Simultaneously, the preform 27 will couple the metal plate 26 to contact 24. Also, the preform 29 fuses to the metal plate 26 thus facilitating the establishment of electrical contact to the top surface of the plate 26. Conventional techniques can be used to provide electrical coupling to the gate contact 25.

Observation of FIG. 1 will highlight some of the deficiencies of the prior art alluded to above. For example, a substantial number of parts is required. Furthermore, the assembly illustrated in FIG. 1 is not optimized for device pellet sales because the second major surface is not well protected. Additionally, the thin preforms 27, 28, and 29 are difficult to fixture and hold in position, and, if a preform is out of position when the assembly is heated, the resulting assembly can be defective. For example, if the preform 27 is slightly out of place and overlies a portion of the contact 25, a conductive path may be established between the contacts 24 and 25, thus rendering the device dysfunctional.

Figure 2:
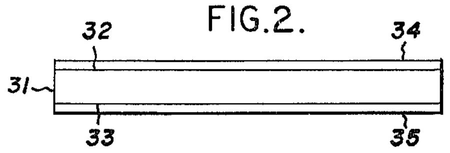
FIG. 2 is a sectional elevation view of an improved semiconductor mounting plate.

Referring next to FIG. 2, there is shown an improved metal plate 31 defining a first surface 32 and a second surface 33. As illustrated, the surfaces 32 and 33 are both clad with layers of solder 34 and 35, respectively. However, as will be more apparent below, the subject invention can be practiced with only one surface 32 being coated with solder 34.

Selection of the proper material for the plate 31 is within the ability of those skilled in the semiconductor art. For example, the plate can be copper if low cost and good thermal transfer properties are desired, or it can be molybdenum if the assembly to be made will be subjected to significant thermal cycling. With respect to the solder 34 and 35, high tin solders are inexpensive and compatible with the overall system, but a high lead solder may be desired if good thermal fatigue properties are important.

Figure 3:
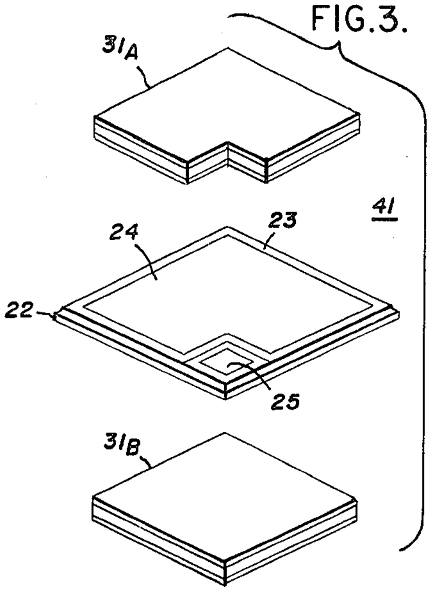
FIG. 3 is an exploded view of an improved semiconductor assembly utilizing mounting plates such as that depicted in FIG. 2.
Figure 4:
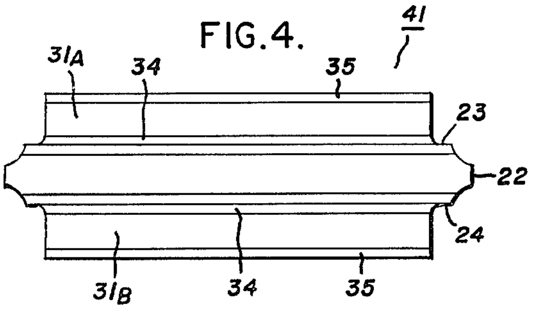
FIG. 4 is an elevation view of the semiconductor assembly shown in FIG. 3.

Referring now to FIGS. 3 and 4, there is shown a preferred semiconductor assembly 41 utilizing the semiconductor pellet 22 and two of the improved mounting plates 31. It should be pointed out that the upper mounting plate 31A, which is best seen in FIG. 3, is similar to the lower plate 31B except that a corner has been removed to avoid coupling the contact 24 to the gate contact 25. The precise shape of the plates is not considered inventive; it being understood that the shape of the plates conforms to the shape of the associated contacts. The metallic contacts on the pellet 22 are omitted in FIG. 4 and subsequent views to preserve clarity.

As is shown most clearly in FIG. 4, the solder layer 34 of each of the plates 31 is adjacent the pellet 22. Preferably, each plate is substantially coextensive with the contact to which it is to be bonded, thus insuring good electrical and thermal coupling. As the structure 41 is viewed in FIG. 4, nothing is connected to the solder layers 35. Connections to those layers are generally made when the pellet is finally installed in a circuit or a conventional style semiconductor device housing. For example, the solder layer 35 of the plate 31B (which is best shown in FIG. 4) can be connected to a header in a conventional stud mounted SCR package. The solder layer 35 of the plate 31A can be connected to the anode lead. Alternatively, with the two metal plates 31 affixed to the pellet 22, a substantial degree of physical protection is provided and pellet sales is an attractive possibility. Then, during installation, the solder layers 35 can couple the pellet 22 directly to a printed circuit board or other substrate.

Figure 5:
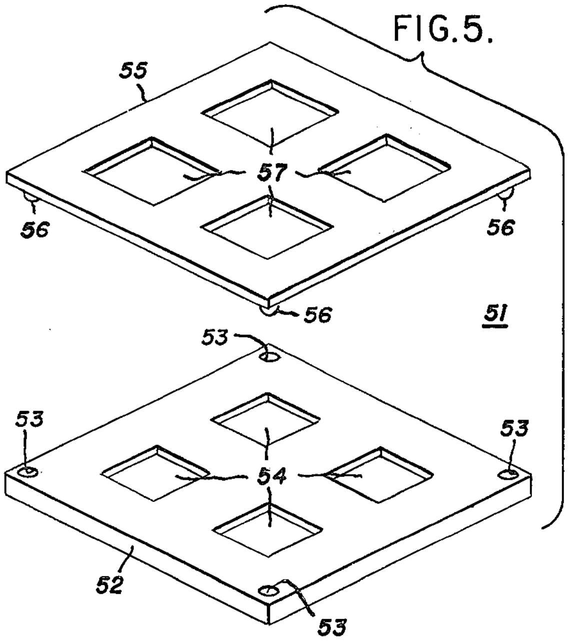
FIG. 5 is an exploded view of an apparatus for manufacturing the assembly shown in FIGS. 3 and 4.

Referring now to FIG. 5, there is shown an isometric view of a frame apparatus 51 for properly juxtapositioning the pellet 22 with respect to the plate 31. A lower frame 52 includes four index openings 53 on the corners and four larger alignment recesses 54 toward the interior region thereof. It will be appreciated that the lower frame preferably contains more than four recesses 54 but that in FIGS. 5, it is diagramatically illustrated for simplicity as having only four recesses. The recesses 54 are sized such that each receives a single solder clad plate 31 by, for example, a shaker feed process. In order to use shaker feed techniques, it is only necessary to couple the frame 52 to a conventional shaker feed apparatus such as those manufactured by the Syntron Division of FMC Corporation, Homer City, Pa. Furthermore, the frame 52 preferably has a lip around the periphery to restrain pellets during the shaker feed process. The lip, however, has been omitted from the Figure to preserve clarity.

An upper frame 55 carries four index pins 56 that enter the index openings 53 to assure proper juxtaposition of the upper frame 55 with respect to the lower frame 52. Also included in the upper frame 55 are four openings 57 that are sized to accommodate semiconductor pellets 22. The number of openings 57 matches the number of recesses 54 and thus it will be appreciated that there will typically be more than four openings 57.

Figure 6:
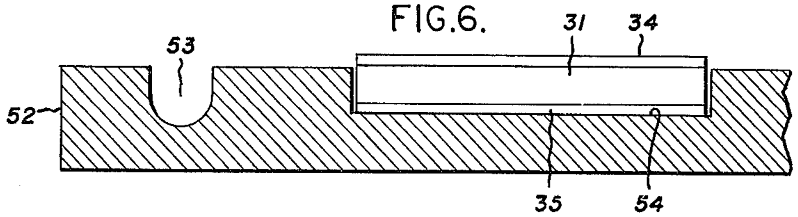
FIGS. 6 and 7 illustrate manufacturing steps employed when utilizing the apparatus shown in FIG. 5.

Referring next to FIG. 6, there is shown a portion of the lower frame 52 illustrating how a solder clad metal plate 31 fits into the recess 54. It will be appreciated that the upper surface of the solder layer 34 is above the surface of the lower frame 52. Thus, only one metal plate 31 will fit in each recess 54 and, furthermore, anything resting upon the assembly illustrated in FIG. 6 will rest upon the solder layer 34 rather than the frame 52.

To insert the metal plates 31 in the frame 52, the frame preferably is coupled to a conventional shaker feed apparatus with an adequate supply of metal plates placed on the frame. Thus, by a shaker feed alignment step, the plates 31 will be disposed in the recesses 54.

Figure 7:
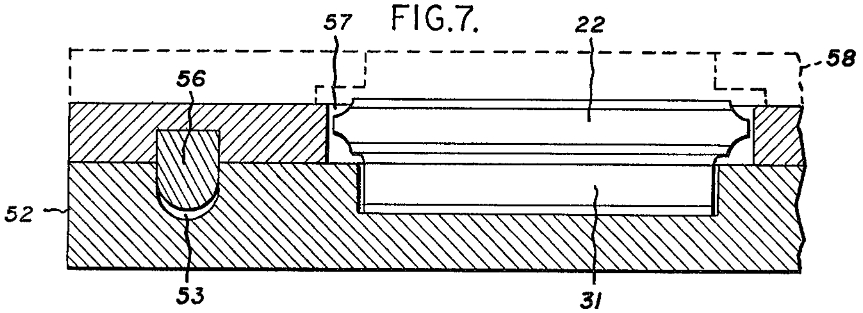

The next step in fabricating the assembly 41 is illustrated in FIG. 7. The upper frame 55 is placed over the lower frame 52 with the index pins 56 in the index openings 53. Then, a quantity of semiconductor device pellets 22 is placed on the upper frame and, by utilization of a conventional shaker alignment step, one pellet is retained in each opening 57. If the pellets are not vertically symmetrical, care should be taken to place them on the frame right side up. Thus, as will be observed from FIG. 7, the pellet 22 and the metal plate 31 are properly juxtaposed. Furthermore, it will be appreciated that the upper surface of the pellet 22 projects slightly above the surface of the upper frame 55. Thus, weight can be placed on the pellet 22 if it is desired to assure intimate contact with the plate. Following the application of any desired weight, the assembly illustrated in FIG. 7 is heated to form a solder bond between the plate 31 and the pellet 22. It is felt that the shaker alignment step is particularly advantageous when fabricating the new assembly since, as compared with the prior art, the new assembly includes very few parts and the parts have sufficient thickness to be easily fixtured.

It will be appreciated that the apparatus 51 illustrated and explained thus far provides an assembly with only one metal plate 31 on one side of a semiconductor pellet 22. Such a device will frequently be found useful. For example, it will be appreciated from the prior art illustrated in FIG. 1 that often only one metal plate is used in conventional devices. However, should it be desired to provide an assembly such as that denoted 41 in FIGS. 3 and 4 wherein two metal plates 31 are applied, all that is necessary is to provide another frame for positioning the second metal plates. Such a frame is illustrated in phantom in FIG. 7. Appropriate indexing pins (not shown) are provided on the third frame and mate with index openings (not shown) formed in the frame 55. It will be observed in FIG. 7 that the frame shown in phantom defines an opening 58 to receive yet another metal plate 31. The plate 31 is positioned in the opening 58 by shaker alignment techniques. If it is desired to utilize the two plates, the aforementioned heating step is preferably delayed until both plates 31 are in position and then the structure illustrated in FIG. 7, including the frame shown in phantom, is heated.

Figure 8:
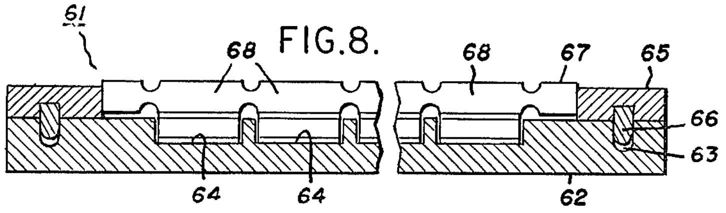
FIG. 8 illustrates a variation of the apparatus shown in FIG. 5.

Referring now to FIG. 8, there is shown an alternate frame apparatus 61 including a lower frame 62 with index openings 63 and recesses 64 to accommodate metal plates 31. An upper frame portion 65 supports index pins 66 and fits over the lower frame 62 in a manner similar to the relationship illustrated in FIG. 7 for the frame 51. However, the upper frame 65 is sized to accommodate an entire semiconductive wafer 67. The wafer 67 defines two major surfaces and contains a preselected distribution of conductivity altering impurities such that a plurality of semiconductor device pellets 68 is formed. FIG. 8 illustrates how proper juxtaposition among the metal plates 31 and the pellets 68 in the wafer 67 is maintained. Use of the frames 62 and 65 is similar to use of the frames 52 and 55. The plates 31 can be put in place by a shaker alignment step. Then, the frame 65 and the wafer 67 can be put in place by a manual operation.

If it is desired to apply the metal plates 31 to each side of the wafer 67, a third frame, similar to the frame shown in phantom in FIG. 7, is utilized. When the third frame and the second set of metal plates 31, if any, are in place, the entire structure is heated and cooled to form solder bonds between the plates 31 and the pellets 68.

Alternately, plates can be bonded to the second side by assembling the apparatus shown in FIG. 8 and heating to bond, then, removing the bonded wafer and plate combination, refilling the lower frame 62 with plates and placing the wafer, with the previously bonded plates up, in the frame 65. A second heating step would follow. If desired, the second set of plates can have a lower melting point solder so that the second heating step is carried out at a lower temperature and does not affect the first formed bonds.

Figure 9:
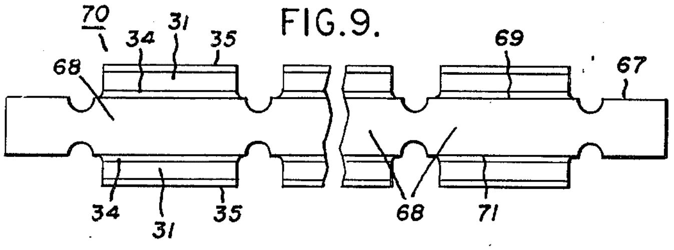
FIG. 9 shows a semiconductor assembly similar to that shown in FIGS. 3 and 4 but which employs an entire semiconductive wafer with a plurality of device pellets therein.

The structure 70 resulting from the utilization of apparatus as shown in FIG. 8 is illustrated in FIG. 9. A semiconductive wafer 67, which defines a first major surface 69 and a second major surface 71, carries solder clad metallic plates 31 on both surfaces of each of the pellets 68. The wafer can be shipped in the form shown or can be subdivided into device pellets prior to shipment or installation in a conventional package.

It will be understood that in the embodiment 70 the metal plates and associated metallic contacts are coextensive.

It will be appreciated, of course, that the outer solder layers 35 can be eliminated in any of the embodiments, if desired. It may be desired to eliminate the outer layers if, for example, the substrate to which the assembly 41 is to be affixed is incompatible with common solders and an unusual solder system shall ultimately be needed. Or, it is possible that the substrate to which the assembly is to be bonded may itself carry a solder layer and thus provide the solder for coupling. However, it is preferable that the solder be included on both sides of the metal plates 31 inasmuch as that obviates the need to orient the plates so as to insure that it is the soldered side that is adjacent the semiconductor pellet or wafer.

Again, it should be emphasized that temporary connections can be made to either of the embodiments 41 or 70 so that they can be tested prior to shipping or packaging.

Figure 10:
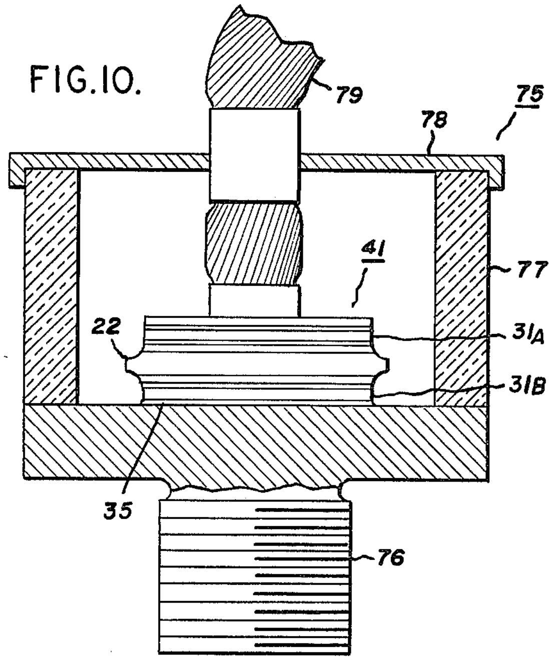
FIG. 10 illustrates the "pedestal" structure resulting from the use of the subject method.

Referring now to FIG. 10, there is schematically shown a stud mounted semiconductor device 75 including a studded header 76 on which the assembly 41 is mounted. The solder layer 35 of the plate 31B forms a solder bond between the studded header 76 and the plate 31B thus establishing thermal, electrical, and mechanical coupling between the semiconductor pellet 22 and the header 76. An annular ceramic sleeve 77 is hermetically coupled to the header 76 and to an end cap 78. Projecting through the center of the cap 78 is an anode lead 79 that is coupled to the layer 35 on the plate 31A. With the exception of the assembly 41, the entire device 74 is of a conventional design. The connection to the gate contact 25 is not shown in FIG. 10 and can be made by conventional methods. Thus it will be appreciated that, while the assembly 41 is well adapted to pellet sales, it is also easily installed in more conventional semiconductor housings.

It will be observed in FIG. 10 that the lower surface of the pellet 22 is separated from the plane of the header 76 by the metal plate 31B and the associated solder layers and is thus on a "pedestal." The significance of that will be explained below.

Figure 11:
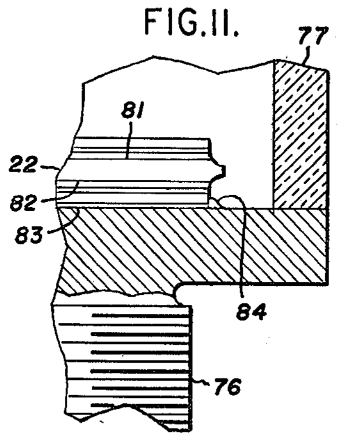
FIG. 11 illustrates a problem encountered when using prior art techniques and which is overcome by use of the subject invention.

In FIG. 11 there is illustrated a portion of a similar header 76 with a semiconductor pellet 22 affixed thereto according to the prior art. The pellet typically contains at least two PN junctions 81 and 82 and is bonded to the header 76 by a layer of solder 83. Typically, the solder 83 is a solder preform that has been placed between the pellet and the header prior to a heating step. A difficulty encountered in the prior art is illustrated in FIG. 11. A certain amount of pressure is typically applied to the pellet 22 during the heating step to assure a good, void-free coupling between the pellet 22 and the header 76. This squeezes some solder out near the periphery of the pellet and forms a solder bead 84. It will be appreciated that the bead 84 may short the junction 82, degrade any passivant present or substantially reduce the creepage path. Observation of FIG. 10 shows that bead formation and resultant shorting is much less likely when practicing the subject method since there is no narrow crevice formed in the structure 75 so that solder bead formation is less likely but any bead formed merely runs down the side of the plate 31B.

It should be pointed out that previous attempts have been made to alleviate the problem of solder beads. Specifically, it is known to form a pedestal, or raised area, in the center of the upper surface of the header. However, to provide effective thermal and mechanical coupling, the pedestal must be substantially coextensive with the pellet. But, to prevent bead formation the pellet periphery must project beyond the pedestal periphery. Thus, alignment is critical. Alignment is not critical when practicing the subject invention as illustrated in FIG. 10.

It will also be realized by those skilled in the art that the subject invention is equally applicable to many types of semiconductor devices including SCR's, triacs, and rectifiers.

In view of the foregoing, many modifications and variations of the present invention will be obvious to those skilled in the art. It is desired, therefore, that the invention be limited only by the following claims.

What is claimed is:

1. A method for manufacturing semiconductor devices comprising the steps of:

providing a body of semiconductive material that defines first and second major surfaces and contains a preselected distribution of conductivity altering impurities such that at least one semiconductor device pellet is formed;

providing at least one metallic plate having at least one side coated with solder;

positioning said plate on said first major surface with said solder adjacent said first major surface, said positioning step comprising a shaker alignment step; and heating said body and said plate to form a solder bond between said body and said plate.

2. A method according to claim 1 wherein said body has a metallic content on at least a portion of said first major surface and said solder is adjacent said metallic contact and said metallic plate is substantially coextensive therewith.

3. A method according to claim 2 wherein said body has a second metallic contact on said second major surface and said method comprises the step of providing a second metallic plate having at least one side coated with solder and positioning it adjacent said metallic contact, said step of positioning said second plate comprising a shaker alignment step.

4. A method according to claim 3 wherein both said metallic plate and said second metallic plate are coated with solder on both sides.

5. A method for manufacturing semiconductor devices comprising the steps of:

providing a body of semiconductive material that defines first and second major surfaces and contains a preselected distribution of conductivity altering impurities such that at least one semiconductor device pellet is formed and wherein at least a portion of each of said major surfaces has a metallic contact thereon;
providing a plurality of metal plates coated with solder on each side;
positioning, by shaker alignment techniques, one of said plates adjacent to each of said contacts; and
heating said plates and body such that solder bonds are formed therebetween.

6. A method according to claim 5 comprising, following said heating step, the step of making temporary electrical connections to said metal plates and electrically testing said pellet.

7. A method for manufacturing semiconductor devices comprising the steps of:
providing a wafer of semiconductive material that defines first and second major surfaces and contains a preselected distribution of conductivity altering impurities such that a plurality of semiconductor device pellets is formed;
providing a plurality of metallic plates, each having at least one side coated with solder;
positioning a plurality of said plates adjacent said first major surface such that a separate plate is positioned substantially coextensively with each of said device pellets, said one side coated with solder being adjacent said first major surface; and
heating said wafer and said plurality of metallic plates such that solder bonds are formed between said plates and said wafer.

8. A method according to claim 7 wherein said positioning step comprises a shaker alignment step.

9. A method according to claim 7 wherein said first major surface of said wafer has a plurality of metallic contacts thereon, with one of said contacts adjacent each of said semiconductor device pellets, and wherein said plates are adjacent to and bonded to said metallic contacts.

10. A method according to claim 9 wherein said second major surface has a plurality of second metallic contacts, said method further comprising:
providing a plurality of second metallic plates, each having a surface covered with solder; positioning said surface covered with solder of said second plates adjacent said second major surface with one of said second plates adjacent each of said second contacts; and
heating said second plates and said wafer such that solder bonds are formed.

11. A method according to claim 10 wherein said metallic contacts and said metal plates are substantially coextensive and said second metallic contacts and said second metal plates are substantially coextensive.

12. A method for manufacturing semiconductor devices comprising the steps of:
providing a wafer of semiconductive material that defines first and second major surfaces and contains a preselected distribution of conductivity altering impurities such that a plurality of semiconductor device pellets is formed, said wafer having a plurality of metallic contacts on each of said major surfaces, with one of said contacts adjacent each side of each of said semiconductor pellets;
providing a plurality of metallic plates having solder on each side thereof, said plates being approximately the same size as said metallic contacts.
positioning one of said plates on each of said metallic contacts, said positioning step comprising a shaker alignment step;
heating said plates and said wafer such that solder bonds are formed between said plates and said wafer; and
subdividing said wafer between said pellets.

13. A method according to claim 12 comprising, following said heating step, the step of making temporary electrical connections to said metal plates and electrically testing said pellet.

14. A semiconductor assembly comprising:
a semiconductor wafer defining first and second major surfaces and containing a preselected distribution of conductivity altering impurities such that a plurality of semiconductor device pellets is formed;
a plurality of metallic contacts on said first major surface, a separate contact being disposed on each of said semiconductor device pellets; and
a plurality of metallic plates, one of said plates soldered to each of said metallic contacts.

15. An assembly according to claim 14 further comprising a plurality of second metallic contacts on said second major surface and a second plurality of metallic plates soldered to said second metallic contacts.

16. An assembly according to claim 15 wherein each of said metallic plates and said second metallic plates is solder clad on each side.

* * * * *